United States Patent [19]

Koyama

[11] Patent Number: 5,045,782
[45] Date of Patent: Sep. 3, 1991

[54] NEGATIVE FEEDBACK HIGH CURRENT DRIVER FOR IN-CIRCUIT TESTER

[75] Inventor: Hiroshi Koyama, Fort Collins, Colo.

[73] Assignee: Hewlett-Packard Company, Palo Alto, Calif.

[21] Appl. No.: 469,668

[22] Filed: Jan. 23, 1990

[51] Int. Cl.⁵ .................. G01R 15/00; G01R 15/12
[52] U.S. Cl. ............... 324/158 R; 324/73.1; 371/22.6; 307/362
[58] Field of Search ............... 324/73.1, 158 R; 364/580; 371/22.1, 22.6; 307/362, 359; 330/152, 291, 293, 310, 311

[56] References Cited

U.S. PATENT DOCUMENTS

| | | | |
|---|---|---|---|
| 3,581,221 | 5/1971 | Martin | 330/291 |
| 3,622,876 | 11/1971 | Ure et al. | 371/22.6 |
| 3,863,173 | 1/1975 | Scheib et al. | 330/293 |
| 4,012,625 | 3/1977 | Bowen et al. | 371/22.6 |
| 4,070,565 | 1/1978 | Borrelli | 364/580 |
| 4,216,539 | 8/1980 | Raymond et al. | 371/22.6 |
| 4,339,819 | 7/1982 | Jacobson | 371/22.6 |
| 4,439,858 | 3/1984 | Petersen | 371/22.6 |
| 4,551,687 | 11/1985 | Lukens | 330/311 |
| 4,563,652 | 1/1986 | Hofer | 330/310 |
| 4,701,701 | 10/1987 | Takagi | 364/580 |
| 4,774,455 | 9/1988 | Williams | 371/22.1 |
| 4,779,043 | 10/1988 | Williamson, Jr. | 324/158 D |
| 4,797,627 | 1/1989 | Chism et al. | 324/603 |
| 4,813,005 | 3/1989 | Redig et al. | |
| 4,827,208 | 5/1989 | Oliver et al. | 371/22.6 |

Primary Examiner—Kenneth A. Wieder
Assistant Examiner—William J. Burns

[57] ABSTRACT

A negative feedback high current driver for an in-circuit tester comprises a three stage amplifier for supplying a high current overdriving signal to a device under test. The high current overdriving signal substantially cancels out any remaining component of an in-circuit generated signal appearing at an input to the device under test.

18 Claims, 3 Drawing Sheets

FIG. 2 PRIOR ART
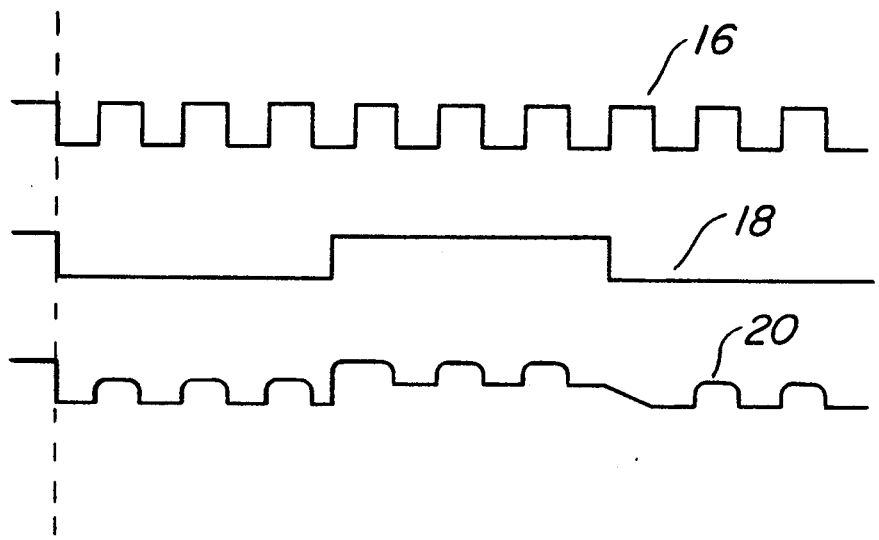
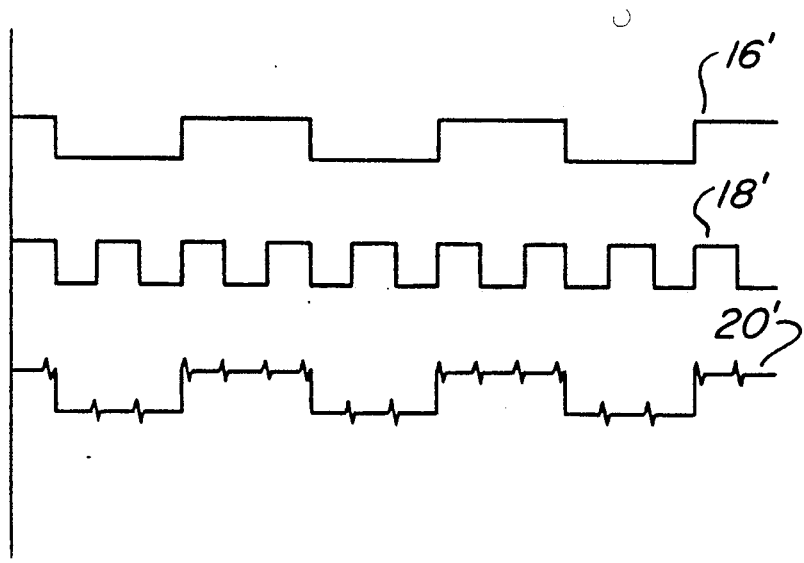
FIG. 5

NEGATIVE FEEDBACK HIGH CURRENT DRIVER FOR IN-CIRCUIT TESTER

FIELD OF THE INVENTION

The present invention relates generally to in-circuit testing of electronic components. More particularly, the present invention relates to an apparatus and method for externally overdriving high current signals generated in the circuit under test.

BACKGROUND OF THE INVENTION

In-circuit testing apparatus are known in the art. See, for example, copending application Ser. No. 175,713 filed 3/31/88, issued 12/14/89 as U.S. Pat. No. 488854 entitled "Programmatically Generated In-Circuit Test of Digital to Analog Converters" and copending application Ser. No. 175,874 filed 3/31/88, issued 8/7/90 as U.S. Pat. No. 4,947,106 entitled "Programmatically Generated In-Circuit Test of Analog to Digital Converters." See also U.S. Pat. No. 4,797,627. As is known, in-circuit testing involves electrically isolating the device under test ("DUT") from the remainder on the devices on the circuit board under test ("BUT"), then performing "pinchecks" and/or "functionality tests" on the DUT.

A common method of electrically isolating a DUT is to overdrive the DUT's inputs with externally generated signals of greater magnitude than those generated on the BUT. The externally generated overriding signals are of known voltage, frequency, etc., and, when they successfully override the signals generated in-circuit, the DUT responds to the externally generated signal rather than to the in-circuit generated signal. If overdriving is successful, then the DUT output can be accurately compared to an expected response by the in-circuit tester. However, if overdriving is not successful, or if the overdriving signal combines with or adds to the in-circuit generated signal, then the actual input to the DUT is unknown and hence the output cannot be accurately compared to an expected response. This is particularly a problem with in-circuit testers that have overdrive current limitations and in-circuit testers that are incapable of synchronizing their overdrive signals with those to be overdriven on the BUT.

Consider the example of FIG. 1. High current, high frequency clock pulses from an asynchronous can-type oscillator 12 on the BUT 10 directly drive a plurality of digital DUT's 14. As shown in FIG. 2, an attempt to overdrive the oscillator's clock pulses 16 with externally supplied pulses 18 from an in-circuit tester, such as a Hewlett-Packard Model 3065, results in an asynchronous combined clock signal 20 since the two clock signals are not synchronized. The combined clock signal 20 has variable amplitude and is severely distorted, even though the externally and internally generated clock signals are each bilevel. Applying a signal like that indicated by 20 to the clock inputs of the DUT's 14 would not produce any predictable output.

It is therefore desirable to provide an apparatus and method for use with an in-circuit tester that predictably overdrives the in-circuit generated signal and which is simple and inexpensive to implement. The present invention achieves these goals.

SUMMARY OF THE INVENTION

An apparatus for externally overdriving an in circuit generated signal supplied to a device under test (DUT) in the circuit comprises first means for receiving as an input a first signal indicative of an overdriving signal desired to be applied to the DUT. The first means also receives as an input a second signal indicative of an actual signal received by the DUT, and provides as an output a signal indicative of the difference between the first and second signals. A second means receives the output signal from the first means and applies the same as a high current overdriving output signal to the DUT. The second signal is derived from the high current overdriving output signal and the high current overdriving output signal substantially cancels any remaining component of the in-circuit generated signal appearing at the DUT.

Preferably, the first signal is derived from a test signal provided by an in-circuit tester, and the test signal is buffered prior to being supplied to the first means.

In the preferred embodiment, the first means comprises a differential input amplifier and the second signal is applied as negative feedback to an inverting input thereof so that the output signal from the first means has a polarity opposite that of any difference between the first signal and any remaining component of the in-circuit generated signal appearing at the DUT. As a result, the high current overdriving output signal is substantially synchronized with both the first signal and the in-circuit generated signal. An important benefit of the invention is that the apparatus may be disposed externally of the in-circuit tester and the BUT and in-line between the in-circuit tester and the BUT.

According to a preferred embodiment of the invention, the apparatus comprises first and third amplifier stages each configured to provide a gain of substantially unity magnitude, and a second amplifier stage configured to provide a gain having a magnitude substantially greater than unity. The first amplifier stage includes a first differential input amplifier for receiving the test signal at an inverting input thereof. The output of the first amplifier stage defines a servo reference signal.

According to this preferred embodiment, the second amplifier stage comprises a second differential input amplifier for receiving at an inverting input thereof the sum of the servo reference signal and a feedback signal derived from an output of the apparatus. The second amplifier stage supplies an output signal having a polarity opposite that of any difference between the servo reference signal and any remaining component of the in-circuit generated signal appearing at the DUT. The second amplifier stage also preferably comprises a voltage divider for receiving the output signal from the second differential input amplifier, and a negative feedback loop for feeding back to the inverting input of the second differential input amplifier a portion of the output signal applied to the voltage divider. The voltage divider circuit permits adjustment of the gain of the second stage.

Still further, according to this preferred embodiment, the third amplifier stage comprises a plurality of parallel current amplifiers for receiving the output from the second differential input amplifier and supplying a high current overdriving signal to the DUT. The high current overdriving signal substantially cancels out any remaining component of the in-circuit generated signal appearing at the DUT. The feedback signal is preferably derived from the high current overdrive signal.

BRIEF DESCRIPTION OF THE DRAWINGS

FIG. 2 depicts the problematic combined signal waveform obtained with prior art in-circuit testers.

FIG. 5 depicts exemplary signal waveforms obtained from practice of the present invention.

DETAILED DESCRIPTION OF THE INVENTION

Figure 1:
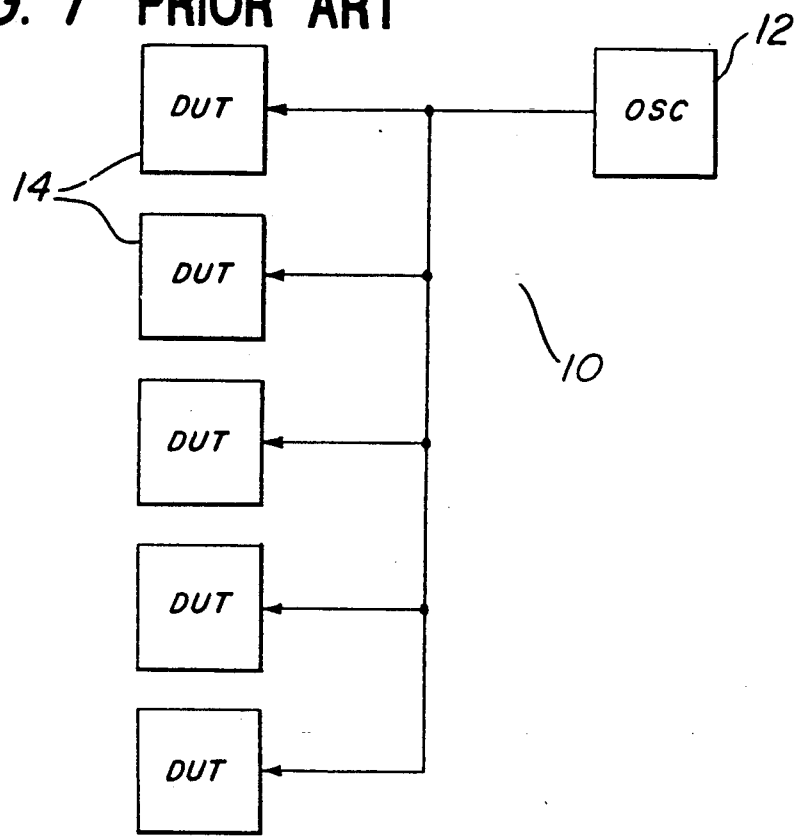
FIG. 1 is a simplified diagram of an exemplary BUT provided for the purpose of illustrating the problem in prior art in-circuit testers.
Figure 3:
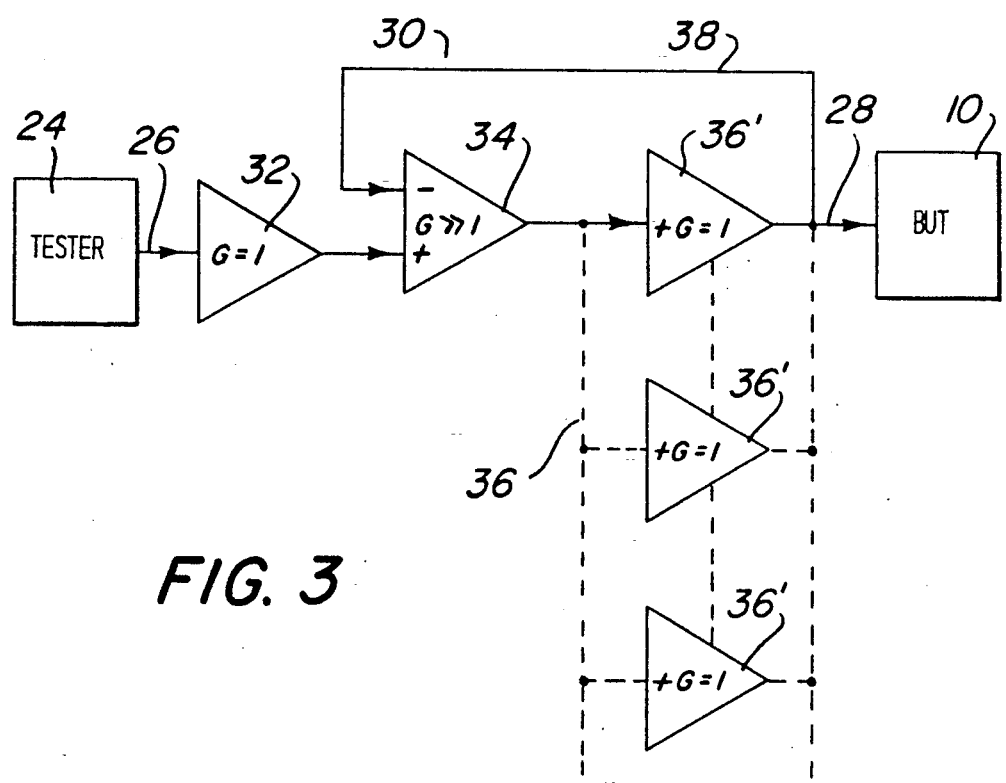
FIG. 3 is a simplified block diagram illustrating the principles of the present invention.

Referring now to the drawings, wherein like numerals represent like elements, there is shown in FIG. 3 an apparatus 30 provided in accordance with the present invention. As shown, the apparatus 30 may be disposed between a conventional prior art in-circuit tester 24, such as the Hewlett-Packard Model 3065, and the BUT 10. Alternatively, if desired, the circuit 30 may be integrated within the in-circuit tester 24, but an important benefit of the invention is that it can be provided externally of the in-circuit tester 24 by a simple in-line connection without modification to the internal circuitry of the in-circuit tester 24.

The in-circuit tester 24 provides, among other signals, clock signals on a line 26 for overriding those generated on the BUT 10, e.g., by the can oscillator 12. The clock signals on line 26 are processed by the circuitry 30 in a manner to be described hereinafter and then supplied to the BUT on line 28, as shown.

The apparatus 30 is preferably a wideband negative feedback amplifier with high current output and may assume the general configuration illustrated in FIG. 3. In a preferred embodiment, the apparatus is a three stage amplifier comprising a buffer 32 (first stage), a high gain differential input amplifier 34 configured for negative feedback (second stage), and a high current amplifier 36 (third stage).

The amplifier 32 (first stage) buffers the clock output from the in-circuit tester 24 and provides it to the non-inverting input of amplifier 34 (second stage) as a servo reference signal. Preferably, the first stage is configured to provide a gain with a magnitude of unity. This may be achieved by either adjusting the gain of the amplifier 32 to unity or by attenuating the input signal and adjusting the gain by a corresponding upward amount.

The inverting input of amplifier 34 (second stage) receives as feedback on line 38 a signal representing the combined output of the third stage and any portion of the output of the oscillator 12 on the BUT 10 received by the DUT that has not been successfully overdriven. The amplifier 34 detects the difference between the servo reference signal (i.e., the output of first stage) and the combined signal appearing on line 38. The output of amplifier 34 is a signal indicative of the difference between the clock signal provided by the in-circuit tester on line 26 and any remaining component of the in-circuit generated signal received by the DUT's, i.e., as it appears on line 28. It will be appreciated that this signal will have a polarity opposite that of any difference between the servo reference signal and remaining component of the oscillator 12 output appearing on line 28. Preferably, the magnitude of the gain of amplifier 34 is substantially greater than unity and preferably greater than ten.

The high current amplifier 36 (third stage) receives the signal from amplifier 34 (second stage) and applies it to the line 28 as a high current output. It will therefore tend to cancel out any remaining component of the oscillator 12 output appearing on line 28. As shown in FIG. 3, the amplifier 36 may be configured as a plurality of parallel high current drivers 36' to obtain the required current drive. Preferably, the magnitude of the gain of the third stage is unity.

It will be appreciated that the apparatus 30 thus reinforces the desired output signal (i.e., the servo reference signal) and rejects as noise any portion of the signal from oscillator 12 appearing on line 28.

Figure 4:
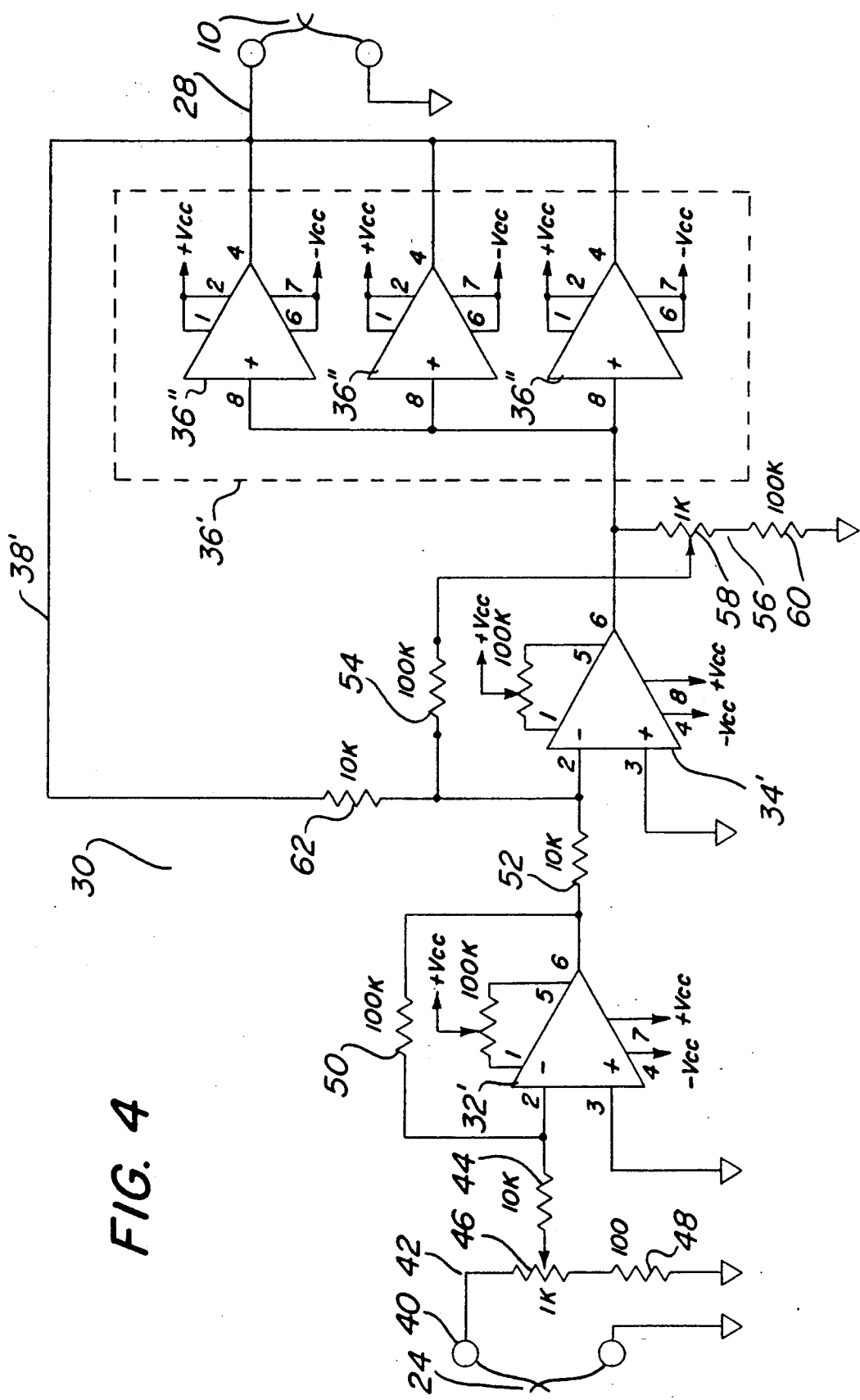
FIG. 4 is a schematic diagram of one preferred embodiment of circuitry for practicing the present invention.

FIG. 4 is a detailed circuit diagram of one preferred implementation of the apparatus 30. Preferred component values are as listed in the diagram.

The first stage comprises a Harris Semiconductor HA2625C differential input operational amplifier 32' configured for a gain of negative ten via input resistor 44 and feedback resistor 50. The input from the in-circuit tester 24 is received at terminals 40 and attenuated by a factor of 0.1 by voltage divider 42 comprising potentiometer 46 and series resistor 48. The attenuated input signal is applied to the inverting input of amplifier 32; the non-inverting input of amplifier 32 is grounded. The magnitude of the effective gain of the first stage is therefore substantially unity (i.e., $-1$). The use of a differential amplifier configured as an inverting amplifier for the first stage has been found to improve common mode rejection for the second stage. Preferably, wires carrying the signal from the in-circuit tester 24 to the terminals 40 are a twisted pair having a length of no greater than about 20 cm to minimize noise pick up.

The second stage comprises a Harris Semiconductor HA2625C differential input operational amplifier 34' receiving the output from the first stage (i.e., the servo reference signal). Amplifier 34' is configured for a negative gain having a magnitude of at least of ten via input resistor 52 and feedback resistor 54. Note that the feedback resistor 54 is not coupled directly to the output of amplifier 34'. Rather, feedback resistor 54 is coupled to feedback a portional amount of the output of amplifier 34' via a voltage divider 56 comprising potentiometer 58 and series resistor 60 so as to provide even greater magnitudes of gain. The voltage divider 56 adjustably approximately 0.1–1.0 of the output of amplifier 34' to feedback resistor 54 to increase the magnitude of the gain. The inverted servo reference signal (inverted by the first stage) is applied to the inverting input of amplifier 34' where it is added to feedback received on line 38'; the non-inverting input of amplifier is coupled to ground. The output signal supplied at the output of amplifier 34' is indicative of any difference between the servo reference signal and any remaining component of the in-circuit generated signal appearing at the DUT. As before, this signal will have a polarity that is opposite that of any difference between the servo reference signal and any remaining component of the oscillator 12 output appearing at the DUT.

The third stage comprises a current buffer array 36', which in the illustrated embodiment comprises three National Semiconductor LH0002CH high current amplifiers connected in parallel as shown. The maximum output current provided by these devices is 400 mA × 3, or 1200 mA. The third stage receives the difference signal from the second stage and supplies the output signal on line 28. A feedback loop 38' is defined by resistor 62 coupled in feedback between the output of the third stage and the input to the second stage. The feedback loop 38' carries the combined signal to the inverting input of the second stage as hereinbefore described. The magnitude of the gain of this stage is preferably unity. Preferably, wires carrying the test signal to the BUT 10 are a twisted pair having a length of no greater than about 20 cm to minimize noise pickup and extra-inductive elements.

FIG. 5 illustrates an exemplary output waveform obtained when the present invention is employed as above described. Waveform 18' represents exemplary clock pulses supplied by the oscillator 12 on the BUT 10 and waveform 16' represents exemplary clock pulses supplied by the in-circuit tester 24 Waveform 20' represents an exemplary output provided by apparatus 30 on line 28 to the BUT 10. It will be seen that the waveform 20' is substantially identical to and synchronized with the waveform 16' supplied by the in-circuit tester 24.

The present invention is not limited to oscillator overdriving or in-circuit testing of digital components. The invention may employed in any application wherein it is desired to provide a "clean" (i.e., noise free) signal to another device. For example, the invention may be employed to eliminate external noise on a noisy channel of a telecommunication board under test. Or, the invention may be employed to absorb excessive signal overshoot/undershoot and thus CMOS latch-up during testing.

The foregoing description of the preferred embodiment is presented for the purpose of illustration only, and is not intended to be exhaustive or to limit the scope of the invention in any respect. Rather, reference should be made to the appended claims for the purpose of construing the true scope of the invention described herein.

What is claimed is:

1. Apparatus for externally overdriving an in-circuit generated signal supplied to a device under test (DUT) in the circuit comprising:
   a) first means for receiving as inputs (i) a first signal indicative of an overdriving test signal desired to be applied to the DUT and (ii) a second signal indicative of an actual signal received by the DUT and for providing as an output a signal indicative of the difference between the first and second signals; and,
   b) second means including high current output driver means for receiving as an input the output signal provided by the first means and applying the same as a high current overdriving output signal to the DUT;
   the second signal being derived from the high current overdriving output signal, the high current overdriving output signal substantially cancelling any remaining component of the in-circuit generated signal appearing at the DUT.

2. Apparatus according to claim 1 further comprising third means for receiving and buffering a test signal from an in-circuit tester and supplying the first signal.

3. Apparatus according to claim 2 wherein the first, second and third means are disposed externally of the in-circuit tester and a board under test (BUT) containing the DUT and in-line between the in-circuit tester and the BUT.

4. Apparatus according to claim 1 wherein the first means comprises a differential input amplifier and the second signal is applied as negative feedback to an inverting input of the differential input amplifier.

5. Apparatus according to claim 1 wherein the output signal from the first means has a polarity opposite that of any difference between the first signal and any remaining component of the in-circuit generated signal appearing at the DUT.

6. Apparatus according to claim 1 wherein the second means comprises a plurality of parallel high current drive amplifiers.

7. Apparatus according to claim 2 wherein the third means comprises a differential input amplifier and defines a first stage of the apparatus.

8. Apparatus according to claim 7 wherein the first stage has a gain amplitude of substantially unity, and the test signal is attenuated by a predetermined amount and the differential input amplifier amplifies the attenuated signal by a substantially corresponding amount.

9. Apparatus according to claim 8 wherein the attenuated test signal is applied to a negative input of differential input amplifier and the differential input amplifier is configured for negative gain.

10. Apparatus according to claim 1 wherein the high current overdriving output signal is substantially synchronized with both the first signal and the in-circuit generated signal.

11. In combination with an in-circuit tester, an apparatus for externally overdriving a signal that is generated on a board under test (BUT) and supplied to a device under test (DUT) in the BUT with a test signal originating from the in-circuit tester comprising:
   a) first amplifier means for receiving and buffering the test signal from the in-circuit tester and supplying a servo reference signal indicative of an overdriving signal desired to be applied to the DUT;
   b) second amplifier means having inverting and non-inverting inputs for receiving at one of the inverting and non-inverting inputs the servo reference signal and for receiving at the inverting input a feedback signal indicative of an actual signal appearing at the DUT and for providing and output signal indicative of a difference between the servo reference signal and the feedback signal; and,
   c) third high current output amplifier/driver means for receiving the output signal from the second amplifier means, supplying high current drive thereto and applying the high current drive signal as the overdriving signal, the overdriving signal substantially cancelling any remaining component of the signal generated on the BUT and appearing at the DUT.

12. Apparatus according to claim 11 wherein the first and third amplifier means define first and third stages, respectively, each having a gain of substantially unity magnitude, and the second amplifier means defines a second stage having a gain with a magnitude substantially greater than unity.

13. Apparatus according to claim 11 wherein the first and second amplifier means are each HA2625C differential input amplifiers.

14. Apparatus according to claim 11 wherein the third amplifier means comprises a plurality of parallel LH0002CH current amplifiers defining a current buffer array.

15. Apparatus according to claim 14 wherein there are three LH0002CH current amplifiers collectively supplying an overdriving signal having up to about 1200 mA drive current.

16. Apparatus according to claim 11 wherein the first, second and third amplifier means are disposed externally of the in-circuit tester and BUT and in-line between the two.

17. Apparatus according to claim 11 wherein the overdriving signal is substantially synchronized with both the test signal and the in-circuit generated signal.

18. Apparatus for driving a test signal from an in-circuit tester to a board under test (BUT), the BUT comprising an oscillator and at least one device to be tested (DUT), the apparatus comprising:

(a) a first amplifier stage configured to provide a gain of substantially unity magnitude, the first stage comprising a voltage divider for receiving and attenuating the test signal and a first differential input amplifier for receiving the attenuated test signal at an inverting input thereof and configured for a gain that substantially offsets the attenuation of the voltage divider, the first differential amplifier providing an output defining a servo reference signal;

b) a second amplifier stage comprising (i) a second differential input amplifier configured for a gain having a magnitude substantially greater than unity for receiving at an inverting input the sum of the servo reference signal and a feedback signal derived from an output of the apparatus and for supplying an output signal having a polarity opposite that of any difference between the servo reference signal and any remaining component of an in-circuit generated signal appearing at the DUT, (ii) a voltage divider for receiving the output signal from the second differential input amplifier, and, (iii) a negative feedback loop for feeding back to the inverting input of the second differential input amplifier a portion of the output signal applied to the voltage divider; and, c) a third amplifier stage comprising a plurality of parallel current amplifiers for receiving the output signal from the second differential input amplifier and supplying a high current overdrive signal to the DUT, the high current overdrive signal substantially cancelling out any remaining component of an in-circuit generated signal appearing at the DUT, the feedback signal being derived from the high current overdrive signal.

* * * * *